United States Patent
Takeda et al.

(10) Patent No.: US 9,163,175 B2
(45) Date of Patent: *Oct. 20, 2015

(54) β-SIALON AND METHOD OF MANUFACTURING THEREOF, AND LIGHT-EMITTING DEVICE (75) Inventors: Go Takeda, Machida (JP); Hisayuki Hashimoto, Machida (JP); Masayoshi Ichikawa, Machida (JP); Tomohiro Nomiyama, Machida (JP); Suzuya Yamada, Machida (JP)

(73) Assignee: DENKI KAGAKU KOGYO KABUSHIKI KAISHA, Tokyo (JP)

( * ) Notice: Subject to any disclaimer, the term of this patent is extended or adjusted under 35 U.S.C. 154(b) by 268 days.

This patent is subject to a terminal disclaimer.

(21) Appl. No.: 13/704,772

(22) PCT Filed: Jul. 28, 2011

(86) PCT No.: PCT/JP2011/067250
§ 371 (c)(1),
(2), (4) Date: Dec. 17, 2012

(87) PCT Pub. No.: WO2012/035893
PCT Pub. Date: Mar. 22, 2012

(65) Prior Publication Data
US 2013/0093314 A1    Apr. 18, 2013

(30) Foreign Application Priority Data
Sep. 16, 2010 (JP) .................................. 2010-208374

(51) Int. Cl.
*C09K 11/64*    (2006.01)
*C09K 11/08*    (2006.01)
(Continued)

(52) U.S. Cl.
CPC ......... *C09K 11/7734* (2013.01); *C09K 11/0883* (2013.01); *H05B 33/12* (2013.01); *H01L 33/50* (2013.01)

(58) Field of Classification Search
USPC .................................................... 252/301.4 F
See application file for complete search history.

(56) References Cited

U.S. PATENT DOCUMENTS 8,404,152 B2 *   3/2013   Emoto et al. ............ 252/301.4 F
8,487,393 B2 *   7/2013   Emoto et al. ................... 257/432

(Continued)

FOREIGN PATENT DOCUMENTS

CN    101575513 A    11/2009
CN    101600778 A    12/2009

(Continued)

OTHER PUBLICATIONS

European Search Report mailed Feb. 6, 2014, issued in corresponding European Application No. 11824901.0-1354 / 2664660.

(Continued)

*Primary Examiner* — Carol M Koslow
(74) *Attorney, Agent, or Firm* — Stein IP, LLC (57) ABSTRACT

β-SiAlON represented by a general formula $Si_{6-z}Al_zO_zN_{8-z}$ with Eu dissolved therein, whose spin density corresponding to absorption g=2.00±0.02 at 25° C. obtained by the electron spin resonance method is equal to or lower than $6.0 \times 10^{16}$ spins/g. A method of manufacturing the β-SiAlON includes: a mixing step of mixing β-SiAlON materials; a baking step of baking the β-SiAlON having undergone the mixing step; a heating step of increasing the ambient temperature of the materials having undergone the mixing step from 1500° C. to a baking temperature of the baking step at a rate equal to or lower than 2° C./min.; an annealing step of annealing the β-SiAlON having undergone the baking step; and an acid treatment step of acid-treating the β-SiAlON having undergone the annealing step. The objective of the present invention is to provide β-SiAlON capable of achieving high luminescent efficiency, a method of manufacturing the β-SiAlON, and a light-emitting device using the β-SiAlON.

11 Claims, 3 Drawing Sheets

(51) Int. Cl.
  *H01L 33/50* (2010.01)
  *C09K 11/77* (2006.01)
  *H05B 33/12* (2006.01)

(56) References Cited

U.S. PATENT DOCUMENTS

| | | | |
|---|---|---|---|
| 2010/0053932 A1 | 3/2010 | Emoto et al. | 362/84 |
| 2010/0213820 A1 | 8/2010 | Sakai et al. | 313/501 |
| 2013/0120691 A1* | 5/2013 | Emoto et al. | 349/69 |
| 2014/0139101 A1 | 5/2014 | Masuda et al. | 313/503 |

FOREIGN PATENT DOCUMENTS

| | | |
|---|---|---|
| EP | 2 093 272 A1 | 8/2009 |
| JP | H 9-90416 A | 4/1997 |
| JP | 2005-255895 | 9/2005 |
| JP | 2007-262417 A | 10/2007 |
| JP | 2008-127547 A | 6/2008 |
| JP | 2009-10315 | 1/2009 |
| JP | 2009-256427 | 11/2009 |
| JP | 2010-43242 | 2/2010 |
| WO | WO 2008/062781 * | 5/2008 |
| WO | WO 2009/048150 A1 | 4/2009 |
| WO | WO 2010/143590 * | 12/2010 |
| WO | WO 2011/058902 | 5/2011 |

OTHER PUBLICATIONS

International Search Report for PCT/JP2007/072443; PCT/ISA/210; mailed Feb. 26, 2008.

Kazuaki Ohkubo, et al., *Absolute Fluorescent Quantum Efficiency of NBS Phosphor Standard Samples*, J. Illum. Engng. Inst. Jpn. Col. 83 No. 2, pp. 87-93, 1999.

International Search Report dated Feb. 15, 2011, issued to the corresponding International Application No. PCT/JP2010/069448.

Chinese Office Action mailed Aug. 12, 2014, issued to corresponding Chinese Application No. 2011800299179.—partial translation.

* cited by examiner

β-SiAlON AND METHOD OF MANUFACTURING THEREOF, AND LIGHT-EMITTING DEVICE

CROSS-REFERENCE TO RELATED APPLICATIONS

This application is a national stage application of PCT Application No. PCT/JP2011/067250, filed Jul. 28, 2011, which claims the benefit of Japanese Application No. 2010-208374, filed Sep. 16, 2010, in the Japanese Intellectual Property Office, the disclosures of which are incorporated herein by reference.

BACKGROUND OF THE INVENTION

1. Field of the Invention

The present invention relates to β-SiAlON usable as a phosphor, a method of manufacturing the β-SiAlON, and a light-emitting device using the β-SiAlON mounted on a blue or ultraviolet diode chip.

2. Description of the Related Art

As disclosed in Patent Literature 1, identifying the spin density corresponding to absorption g=2.00±0.02 at 25° C. obtained by electron spin resonance is known as a method to improve the luminescent properties of β-SiAlON.

CITATION LIST

Patent Literature

Patent Literature 1 WO 2008/062781

Non-Patent Literature

Non-patent Literature 1: Kazuaki Ohkubo et al., "Absolute Fluorescent Quantum Efficiency of NBS Phosphor Standard Samples", Illuminating Engineering Institute of Japan, 1999, Vol. 83, No. 2, pp. 87-93.

SUMMARY OF THE INVENTION

The first objective of the present invention is to provide β-SiAlON capable of achieving higher luminescent intensity with preferable reproducibility even when the wavelength and bandwidth of a phosphor are reduced. The second objective of the present invention is to provide a method of manufacturing the β-SiAlON. The third objective of the present invention is to provide a light-emitting device using the β-SiAlON.

By analyzing in detail the relationship between various kinds of factors involved in synthesis of the β-SiAlON with Eu dissolved therein and the luminescent properties of the synthesized β-SiAlON with Eu dissolved therein, the inventors have attained the knowledge that a phosphor having preferable crystallinity and higher luminescent intensity can be manufactured when the spin density corresponding to the absorption g=2.00±0.02 at 25° C. obtained by ESR is equal to or lower than $6.0 \times 10^{16}$ spins/g, and thus have attained the present invention.

To achieve the first objective, the β-SiAlON of the present invention is the β-SiAlON represented by general formula $Si_{6-z}Al_zO_zN_{8-z}$ with Eu dissolved therein, and its spin density corresponding to the absorption g=2.00±0.02 at 25° C. obtained by ESR is equal to or lower than $6.0 \times 10^{16}$ spins/g.

To achieve the second objective, the method of manufacturing the β-SiAlON of the present invention includes a mixing step of mixing the β-SiAlON materials; a heating step of heating the ambient temperature for the mixed material from 1500° C. to the baking temperature at a rate equal to or lower than 2° C./min.; a baking step of baking the mixed material having undergone the heating step; an annealing step of annealing the β-SiAlON having undergone the baking step; and an acid treatment step of subjecting the β-SiAlON having undergone the annealing step to acid treatment.

Another method of manufacturing the β-SiAlON of the present invention further includes a hot isostatic pressing step of subjecting the β-SiAlON to hot isostatic pressing inserted between the baking step and the annealing step, in addition to the mixing step, heating step, baking step, annealing step, and acid treatment step described above.

It is preferable that in the annealing step, the baked β-SiAlON is heated in an inert gas atmosphere wherein nitrogen partial pressure is maintained at 10 kPa or lower at temperatures from 1350° C. to 1650° C., or in vacuum at temperatures from 1200° C. to 1500° C.

It is preferable that the baked β-SiAlON is immersed in a mixture of hydrofluoric acid and nitric acid, or in ammonium hydrogen fluoride in the acid treatment step.

To achieve the third objective described above, the light-emitting device of the present invention uses the β-SiAlON and a luminescent source.

The β-SiAlON of the present invention is excited by a light in a wide wavelength range from ultraviolet to visual light, and is capable of achieving higher luminescent intensity with preferable reproducibility than β-SiAlON of prior art, providing a superior green phosphor even when the wavelength and bandwidth of the a phosphor are reduced. Thus, the β-SiAlON may be preferably used, by itself or in combination with other phosphor, for white LED using various kinds of light-emitting devices, an ultra-violet or blue LED chip, in particular, as a light source.

According to the method of manufacturing the β-SiAlON of the present invention, the β-SiAlON whose spin density corresponding to the absorption g=2.00±0.02 at 25° C. obtained by electron spin resonance is equal to or lower than $6.0 \times 10^{16}$ spins/g can be manufactured with preferable reproducibility.

Since the light-emitting device of the present invention uses the β-SiAlON with high luminescent efficiency, higher brightness of the light-emitting device can be achieved. Moreover, the light-emitting device of the present invention is also applicable to a light source for the backlight of liquid crystal display panels.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Embodiments of the present invention will hereinafter be described in detail by referring to the drawings.

(β-SiAlON)

The β-SiAlON achieving the first objective of the present invention is formed by dissolving $Eu^{2+}$ as light emission center in β-SiAlON represented by a general formula $Si_{6-z}Al_zO_zN_{8-z}$ as a host crystal.

In the β-SiAlON whose spin density corresponding to the absorption g=2.00±0.02 at 25° C. obtained by ESR is equal to or lower than $6.0\times10^{16}$ spins/g, the host crystal itself absorbs almost no non-luminescent light, and as a result, preferable luminescent properties are achieved.

The spin density described previously is a value per unit mass obtained by dividing the spins measured by ESR by the mass (g (gram)) of the measured sample.

Method of Manufacturing the β-SiAlON

The method of manufacturing the β-SiAlON achieving the second objective of the present invention is described below.

The inventors examined β-SiAlON by the ESR method, and found that unpaired electrons existing due to crystal defects absorb excitation light and fluorescent light derived from $Eu^{2+}$ without emitting light, thereby decreasing the luminescent intensity. To decrease the abundance of unpaired electrons derived from this structural defect, the inventors further examined the method of manufacturing β-SiAlON. As a result, it was found that by optimizing the heating rate in a heating step before the baking step, and by introducing a hot isostatic pressing step, the abundance of unpaired electrons decreases and thus luminescent intensity can be improved.

Figure 1:
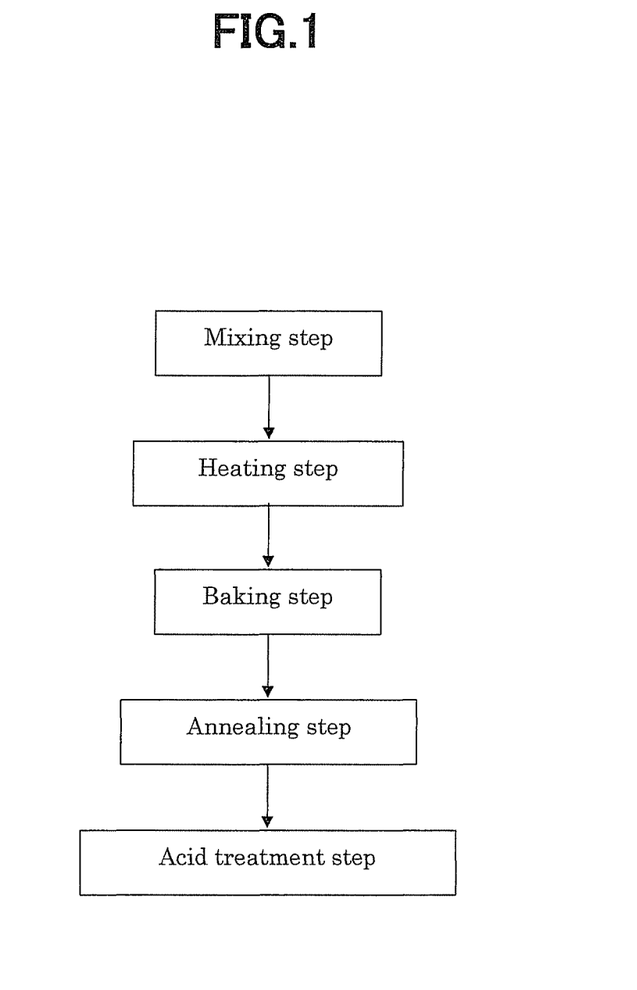
FIG. 1 is a flow chart illustrating a first method of manufacturing the β-SiAlON.

FIG. 1 is a flow chart illustrating a first method of manufacturing β-SiAlON.

As shown in FIG. 1, the first method of manufacturing the β-SiAlON includes a mixing step of mixing materials of the β-SiAlON represented by a general formula $Si_{6-z}Al_zO_zN_{8-z}$; a heating step of heating the ambient temperature of the mixed material from 1500° C. to the baking temperature at a rate equal to or lower than 2° C./min.; an annealing step of annealing the baked β-SiAlON; and an acid treatment step of subjecting the annealed β-SiAlON to acid treatment.

In the heating step, after the temperature reaches 1500° C., the temperature is further increased up to the baking temperature at a heating rate equal to or lower than 2° C./min. The heating rate is adjusted as described above to improve the crystallinity and reduce the spin density of the β-SiAlON. The baking temperature preferably is from 1850° C. to 2050° C.

As β-SiAlON materials, silicon nitride powder, aluminum nitride powder, aluminum oxide powder and/or silicon oxide powder, as well as any of Eu compounds selected from Eu metals, oxides, carbonates, nitrides, and oxynitrides can be used.

In the mixing step, a dry mixing method and a method of mixing materials in an inactive solvent that does not practically react with the components of the materials and then removing the solvent, are applicable. As a mixing apparatus, a V-shaped mixer, rocking mixer, ball mill, or vibrating mill can be used.

It is preferable that in the baking step, the mixed materials are packed in a vessel whose surface that comes into contact with the materials at least is made of boron nitride, a crucible for example, and baked in a baking furnace.

Since the baked β-SiAlON is in a form of a mass, it is preferably crushed using a jaw crusher or roll crusher, and then finely powdered in a ball mill, vibrating mill, jet mill, or the like.

In the annealing and acid treatment steps, products other than the β-SiAlON are removed. Preferably, annealing is performed either in a heating step wherein heat treatment is performed in vacuum and at temperatures from 1200° C. to 1550° C., or in a heating step wherein heat treatment is performed in an inert gas atmosphere with nitrogen partial pressure maintained at 10 kPa or lower and at temperatures from 1300° C. to 1600° C. An acid used in the acid treatment step is preferably a mixture of hydrofluoric acid and nitric acid, or an ammonium hydrogen fluoride.

A second method of manufacturing the β-SiAlON of the present invention is described below.

Figure 2:
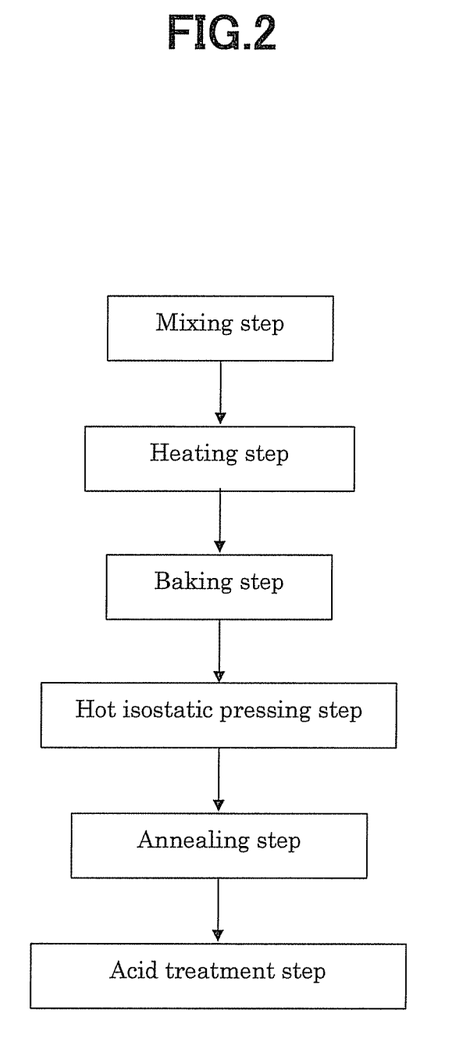
FIG. 2 is a flow chart illustrating a second method of manufacturing the β-SiAlON.

FIG. 2 is a flow chart illustrating the second method of manufacturing the β-SiAlON. As shown in FIG. 2, the second method of manufacturing the β-SiAlON further includes a hot isostatic pressing step of hot-isostatically pressing the baked β-SiAlON, in addition to the mixing step, heating step, baking step, annealing step, and acid treatment step in the first method of the present invention.

In the hot isostatic pressing (hereinafter simply referred to as HIP) step, the baked β-SiAlON is isotropically pressed at a given temperature and under a given pressure using an inert gas as a pressing medium. Nitrogen gas or argon gas can be used as the inert gas.

The temperature in the HIP step preferably is from 1900° C. to 2500° C., and the lower limit is more preferably 2000° C., further preferably 2250° C., and the upper limit is more preferably 2400° C.

The pressure in the HIP step preferably is from 70 MPa to 200 MPa, and the lower limit is more preferably 100 MPa and the upper limit is more preferably 180 MPa.

The introduction of the HIP step minimizes crystal defects, reducing the spin density. This enables the β-SiAlON having higher luminescent intensity to be manufactured.

Light-Emitting Device

A light-emitting device using the β-SiAlON capable of achieving the above-mentioned third objective of the present invention is described below.

Figure 3:
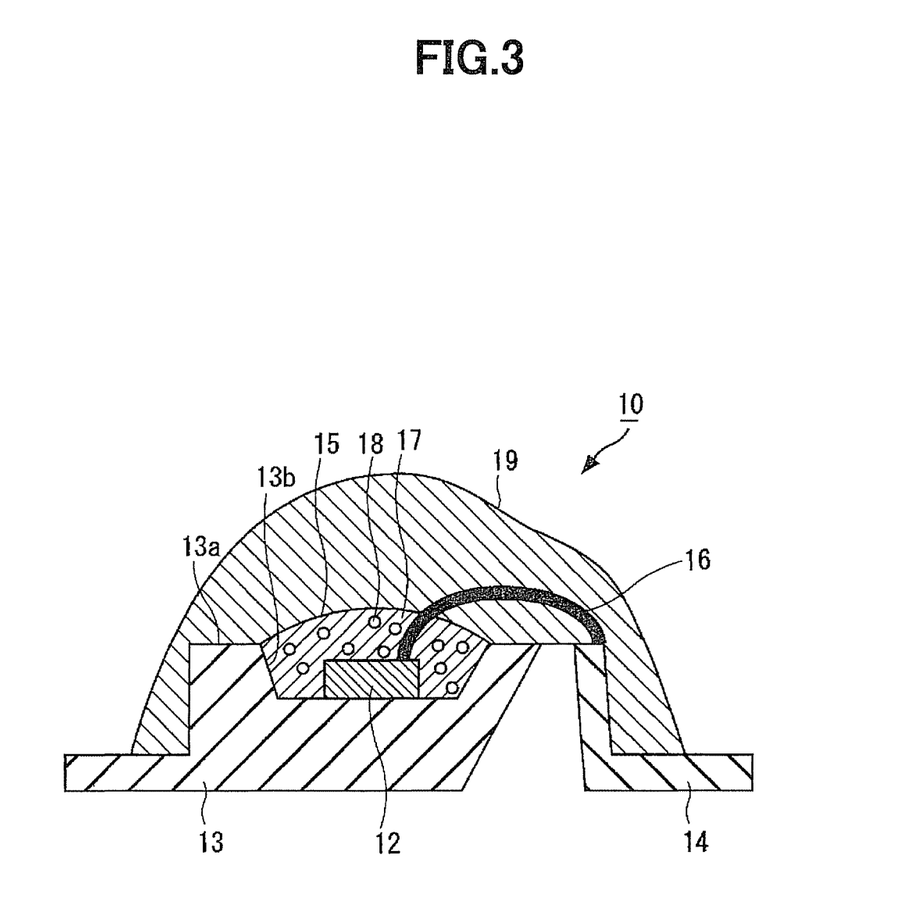
FIG. 3 is a cross-sectional view schematically showing a light-emitting device of the present invention.

FIG. 3 is a cross-sectional view schematically showing an example of the structure of the light-emitting device 10 using the β-SiAlON of the present invention. As shown in FIG. 3, the light-emitting device 10 of the present invention includes an LED chip as a luminescent source 12, a first lead frame 13 having a luminescent source 12, a second lead frame 14, a wavelength conversion member 15 shielding the luminescent source 12, a bonding wire 16 electrically connecting the luminescent source 12 and the second lead frame 14, and a synthetic resin cap 19 covering these parts. The wavelength conversion member 15 includes a phosphor 18 and a sealing resin 17 with the phosphor 18 scattered therein.

A concave 13b is formed on the top surface 13a of the first lead frame 13. The concave 13b has a pore size gradually increasing upward from the bottom thereof. The concave 13b is preferably mirror-plane structured so as to reflect the light emitted from the luminescent source 12.

Any of various types of LED chips can be used as the luminescent source 12, and preferably the LED chip capable of emitting light having the wavelength from 350 nm (near ultraviolet) to 500 nm (blue) is used.

As the phosphor 18 used for the wavelength conversion member 15 of the light-emitting device 10, any of β-SiAlON, α-SiAlON, $CaAlSiN_3$, single YAG or YAG mixture can be used, and as the elements to be dissolved in these, any of europium (Eu), cerium (Ce), strontium (Sr), and calcium (Ca) are available. By combining the luminescent source 12 and the wavelength conversion member 15, a light having higher luminescent intensity can be emitted.

By using a near ultraviolet LED chip or blue LED chip as a luminescent source 12 and the β-SiAlON as the phosphor 18 of the LED chip, and combining single substances or mixtures of red, blue, yellow, and orange luminescent phosphors, the light-emitting device 10 is allowed to emit lights having various wavelengths.

With the light-emitting device 10 according to the first embodiment of the present invention using the β-SiAlON alone, by irradiating, as excitation source, near ultraviolet light or visual light having a wavelength from 350 nm to 500 nm, in particular, as a luminescent source 12, a green light having a peak wavelength from 520 nm to 550 nm is emitted.

When β-SiAlON alone is used as a phosphor 18 for the light-emitting device 10 of the present invention, decrease in brightness is minimized, reflecting the thermally and chemically stable property of the β-SiAlON.

The present invention will hereinafter be described in detail by referring to specific Examples.

Example 1

As shown in FIG. 1, the method of manufacturing the β-SiAlON according to Example 1 includes a mixing step of mixing β-SiAlON materials; a heating step of heating the ambient temperature of the mixed materials to the baking temperature and maintaining the heating rate from 1500° C. to the baking temperature at a rate equal to or lower than 2° C./min.; a baking step of baking the heated β-SiAlON materials into the β-SiAlON; an annealing step of annealing the β-SiAlON after the baking step; and an acid treatment step of subjecting the annealed β-SiAlON to acid treatment.

In the mixing step, a silicon nitride powder (NP-400 grade, oxygen content=0.96 mass %, β-phase content=14.8 mass %, DENKA), aluminum nitride powder (F grade, oxygen content=0.84 mass %, TOKUYAMA), aluminum oxide powder (TM-DAR grade, TAIMEI CHEMICALS), and europium oxide powder (RU grade, Shin-Etsu Chemical) were used as the materials. The materials were formulated in order that the z value calculated from the amount of Al and that of oxygen contained in the materials other than europium oxide became 0.25, and that the europium oxide powder accounted for 0.29 mol %, to obtain the materials of 1 kg in weight.

The obtained materials were dry-mixed using a rocking mixer (RM-10, AICHI ELECTRIC) for 60 minutes and then the total amount was made to pass through a 150 μm stainless sieve.

The materials having passed the stainless sieve were packed in a vessel made of boron nitride (N-1 grade, DENKA) and placed in a carbon heater electric furnace. The ambient temperature in the electric furnace was increased from room temperature to 1500° C. at the rate of 10° C./min., and from 1500° C. to 2000° C. at the rate of 0.6° C./min. Baking was performed in a 0.9 MPa pressurized nitrogen atmosphere at 2000° C. for 15 hours to generate the β-SiAlON. The produced β-SiAlON, which was in a form of a mass, was crushed slightly and then made to pass through a 45 μm sieve to obtain powdered β-SiAlON.

Powder X-ray diffraction (XRD) was performed on the powdered β-SiAlON using a copper Kα ray to identify the crystal phase thereof. As a result, a plurality of minute diffraction lines were identified near the β-SiAlON as a first crystal phase, and around 2θ=33 to 38° as a second crystal phase. The highest diffraction line intensity was 1% or lower of the diffraction line intensity on the 101 surface of the β-SiAlON.

The powdered β-SiAlON was crushed using a sonic jet crusher (PJM-80SP, NPK) to adjust the particle size, packed in a cylindrical vessel made of boron nitride (N-1 grade, DENKA), and then heated at 1450° C. in an Ar atmosphere under the atmospheric pressure for 8 hours in the carbon heater electric furnace as the annealing step.

The entire heated β-SiAlON was made to pass through the 45 μm sieve.

As a result of the XRD measurement of the heated β-SiAlON, a small amount of Si was detected.

The annealed β-SiAlON was then subjected to acid treatment. In the acid treatment step, the β-SiAlON was immersed in a 1:1 mixture of 50% hydrofluoric acid and 70% nitric acid solutions. The acid-treated β-SiAlON was washed with water and dried. The dried β-SiAlON was classified in water and fine powder particles having diameter of 5 μm or smaller were removed. The β-SiAlON from which finely-powdered particles have been removed is the β-SiAlON according to Example 1.

As a result of XRD measurement of the β-SiAlON according to Example 1, no diffraction peak other than that of the β-SiAlON was detected, and the lattice constant a and lattice constant c were respectively 7.6108 Å and 2.9124 Å. The average particle size of the β-SiAlON, from which finely-powdered particles had been removed, found by particle size distribution measurement by the laser scattering method was 10.8 μm.

The fluorescent spectrum measurement of the β-SiAlON according to Example 1 was performed using a spectrofluorophotometer (F4500, Hitachi High Technology).

The peak luminescent intensity of the β-SiAlON according to Example 1 was 207%. In the fluorescent spectrum measurement, the height of the peak wavelength of the fluorescent spectrum was measured using 455 nm blue light as excitation light, and a relative value with respect to the height of the peak wavelength measured using YAG: Ce: phosphor (P46-Y3, Mitsubishi Chemical Corporation) under the same conditions was found as the luminescent intensity. A spectral xenon lamp light source was used as the excitation light.

The CIE chromaticity of the phosphor according to Example 1 was as follows: x=0.343 and y=0.633. The CIE values for the β-SiAlON according to Example 1 were obtained by measuring the fluorescent spectrum of the total luminous flux, namely the collection of fluorescent light generated by 455 nm excitation light, using an instantaneous multichannel photodetector (MCPD-7000, Otsuka Electronics Co. Ltd.) and an integrating sphere. The measurement was performed in accordance with the Non-Patent Literature 1.

50 mg of the β-SiAlON according to Example 1 was put in a sample tube and the ESR measurement was performed at room temperature using an ESR measuring apparatus (JES-FE2XG, JEOL, Ltd.) under the conditions as follows:

Magnetic field sweep range: 3200 to 3400 gauss (320 to 340 mT);

Magnetic field modulation: 100 kHz, 5 gauss;

Irradiated microwave: 9.25 GHz of frequency, 10 mW of output;

Sweeping time: 240 sec.;

Number of datapoints: 2056 points; and

Reference material: MgO with $Mn^{2+}$ thermally-diffused. The reference material is measured together with the sample material.

The ESR spectrum, which sensitively observes any unevenness in an electromagnetic absorption spectrum, is generally drawn as a first differential curve. Since the absorption intensity of the ESR spectrum is proportional to the number of unpaired electrons, the ESR spectrum was integrated twice to convert the differential curve to its corresponding integral curve, and quantitative determination was performed based on the ratio of area thereof to that of the reference sample.

The number of unpaired electrons of the reference sample was obtained based on the result of ESR measurement performed using 0.5 mL of $1.0\times10^{-5}$ mol 1,1-diphenyl-2-picryl-hydrazyl (($C_6H_5)_2NNC_6H_2(NO_2)_3$, hereinafter simply referred to as DPPH)/L benzene solution ($3.0\times10^{15}$ spins), whose the number of unpaired electrons is known, to determine the peak area ratio between the reference sample and the DPPH solution.

The spin density corresponding to the absorption $g=2.00\pm0.02$ of the β-SiAlON in Example 1 was $1.4\times10^{16}$ spins/g.

Example 2

With the method of manufacturing the β-SiAlON according to Example 2, as shown in FIG. 2, after the mixing step, heating step, and baking step, an HIP step was added, and then annealing step and acid treatment step were performed.

Silicon nitride powder, aluminum nitride powder, and europium oxide powder, which were identical to the starting materials used in Example 1, were formulated in order that the z value calculated from the Al content in the powdered materials became 0.1 and the europium oxide powder accounted for 0.29 mol %, and mixed in the same manner as that of Example 1.

The mixed materials were then subjected to the heating step, baking step, and crushing step under the same conditions as those of Example 1.

The β-SiAlON having undergone the crushing step was subjected to HIP step performed at 2350° C. in 155 MPa pressurized nitrogen atmosphere for one hour.

After the HIP step is completed, annealing step, acid treatment step, in-water classification step were performed as in the case of Example 1 to produce the β-SiAlON in Example 2.

As a result of the XRD measurement of the β-SiAlON according to Example 2, no diffraction peak was detected other than that of the β-SiAlON, and the lattice constant a and lattice constant c were respectively 7.6086 Å and 2.9094 Å. The average particle size, which was obtained from the particle size distribution measurement by laser light scattering, was 10.3 μm. The peak luminescent intensity was 231%, and CIE chromaticity values were x=0.338 and y=0.637. The spin density corresponding to the absorption $g=2.00\pm0.02$ was $2.32\times10^{16}$ spins/g.

Example 3

The β-SiAlON according to Example 3 was manufactured under the same conditions as those of Example 2 with the exception that the z value calculated from the Al content in the powdered material was 0.08.

As a result of the XRD measurement of the β-SiAlON according to Example 3, no diffraction peak was found other than that of the β-SiAlON, and the lattice constant a and lattice constant c were respectively 7.6067 Å and 2.909 Å. The average particle size, which was obtained from the particle size distribution measurement by laser light scattering, was 9.2 μm. The peak luminescent intensity of the phosphor was 206%, and the CIE chromaticity values were x=0.323 and y=0.648. The spin density corresponding to the absorption $g=2.00\pm0.02$ was $2.9\times10^{16}$ spins/g.

Comparative Example 1

The β-SiAlON according to Comparative Example 1 was manufactured under the same conditions as those of Example 1 with the exception that in the heating step the temperature was increased from room temperature to 1500° C. at the rate of 20° C./min. and from 1500° C. to 2000° C. at the rate of 5° C./min.

As a result of the XRD measurement of the β-SiAlON according to Comparative Example 1, no diffraction peak was found other than that of the β-SiAlON, and the lattice constant a and lattice constant c were respectively 7.6111 Å and 2.9124 Å. The average particle size, which was obtained from the particle size distribution measurement by laser light scattering, was 10.5 μm. The peak luminescent intensity according to Comparative Example 1 was 190%, and CIE chromaticity values were x=0.358 and y=0.622. The spin density corresponding to the absorption $g=2.00\pm0.02$ was $1.84\times10^{17}$ spins/g.

Comparative Example 2

The β-SiAlON according to Comparative Example 2 was manufactured through the mixing, heating, and baking steps similar to Example 2. The HIP step, annealing step, acid treatment step, and in-water classification step were not conducted after the baking step.

As a result of the XRD measurement of the β-SiAlON according to Comparative Example 2, a weak diffraction peak other than that of the β-SiAlON was found, and the lattice constant a and lattice constant c were respectively 7.6085 Å and 2.9096 Å. The average particle size, which was obtained from the particle size distribution measurement by laser light scattering, was 10.4 μm. The peak luminescent intensity of the phosphor according to Comparative Example 2 was 105%, and the CIE chromaticity values were x=0.309 and y=0.655. The spin density corresponding to the absorption $g=2.00\pm0.02$ was $2.27\times10^{17}$ spins/g.

Comparative Example 3

The β-SiAlON according to Comparative Example 3 was manufactured under the same conditions as those of Example 2 with the exception that the HIP pressing step was not performed.

As a result of the XRD measurement of the β-SiAlON according to Comparative Example 3, no diffraction peak other than that of the β-SiAlON was found, and the lattice constant a and lattice constant c were respectively 7.6083 Å and 2.9095 Å. The average particle size, which was obtained from the particle size distribution measurement by laser light scattering, was 22.0 μm. The peak luminescent intensity according to Comparative Example 3 was 210%, and CIE chromaticity values were x=0.333 and y=0.641. The spin density corresponding to the absorption $g=2.00\pm0.02$ was $2.13\times10^{17}$ spins/g.

Table 1 shows the comparison between the β-SiAlONs according to Examples 1 to 3 and the β-SiAlONs according to Comparative Examples 1 and 2.

TABLE 1

| | Powdered material Z value (Al) | Spin density (spins/g) | Lattice constant a(Å) | Lattice constant c(Å) | Average particle size (μm) | CIE x | CIE y | Peak luminescent intensity (%) |
|---|---|---|---|---|---|---|---|---|
| Ex. 1 | 0.25 | $1.4 \times 10^{16}$ | 7.6108 | 2.9124 | 10.8 | 0.343 | 0.633 | 207 |
| Ex. 2 | 0.10 | $2.32 \times 10^{16}$ | 7.6086 | 2.9094 | 10.3 | 0.338 | 0.637 | 231 |
| Ex. 3ample 3 | 0.08 | $2.9 \times 10^{16}$ | 7.6067 | 2.909 | 9.2 | 0.323 | 0.648 | 206 |
| Com. Ex. 1 | 0.25 | $1.84 \times 10^{17}$ | 7.6111 | 2.9124 | 10.5 | 0.358 | 0.622 | 190 |
| Com. Ex. 2 | 0.10 | $2.27 \times 10^{17}$ | 7.6085 | 2.9096 | 10.4 | 0.309 | 0.655 | 105 |
| Com. Ex. 3 | 0.10 | $2.13 \times 10^{17}$ | 7.6083 | 2.9095 | 22.0 | 0.333 | 0.641 | 210 |

As shown in Table 1, all the β-SiAlONs according to Examples 1 to 3 have the spin density equal to or lower than $6.0 \times 10^{16}$ spins/g. It was found that with the decrease in wavelength of fluorescent spectrum and chromaticity x of the β-SiAlON, the luminescent intensity decreased. The β-SiAlON according to Example 1 has higher luminescent intensity than that of Comparative Example 1 although its chromaticity x was low. The β-SiAlONs according to Example 2 and 3 have higher luminescent intensity than that of Comparative Example 2.

The comparison between Example 1 and Comparative Example 1 reveals that the rate of heating up to the baking temperature affects the spin density and the peak luminescent intensity.

The comparison between Example 2 and Comparative Example 3 reveals that the HIP step also affects the spin density and the peak luminescent intensity. Moreover, the comparison between Example 3 and Comparative Example 3 reveals that the spin density can be decreased by performing the HIP step even if the z value decreases, and that comparable peak luminescent value can be obtained.

Example 4

A light-emitting device using the β-SiAlON according to Example 3 was manufactured as the light-emitting device according to Example 4. The structure of the light-emitting device 10 according to Example 4 of the present invention is identical to that shown in FIG. 3. The phosphor 18 are the mixture of the β-SiAlON according to Example 3 and Ca-α-SiAlON: Eu phosphor represented by a general formula $Ca_{0.66}Eu_{0.04}Si_{9.9}Al_{2.1}O_{0.7}N_{15.3}$. The peak luminescent wavelength of the Ca-α-SiAlON: Eu phosphor 18 was 585 nm and the luminescent efficiency of the phosphor at 450-nm excitation was 60%.

The phosphor 18 were scattered in the sealing resin 17 in the following manner. The phosphor 18 were silane-coupled in advance using a silane coupling agent (KBE402, Shin-Etsu Silicone), and the silane-coupled phosphor 18 were mixed with epoxy resin (NLD-SL-2101, Sanyu Rec) as the sealing resin 17 to make the wavelength conversion member 15.

A blue LED chip having 450 nm wavelength was used as the luminescent source 12. The wavelength conversion member 15 was potted on the blue LED chip 12. Vacuum degassing and heat curing were then performed to manufacture the surface-mounting white light-emitting device 10 according to Example 4.

Comparative Example 4

A light-emitting device 10 according to Comparative Example 4 is identical to that according to Example 4 with the exception that it uses the β-SiAlON according to Comparative Example 2 instead of the β-SiAlON according to Example 3.

The light-emitting devices 10 according to Example 4 and Comparative Example 4 were made to emit light under the same conducting conditions, and their central luminance and CIE chromaticity (CIE1931) were measured under the same conditions using a luminance meter. Their central luminance was compared using a white light-emitting device whose chromaticvity coordinate (x, y) were 0.31 and 0.32, and the light-emitting device 10 according to Example 4 was found to have luminance 1.4 times higher than that of Comparative Example 4.

INDUSTRIAL APPLICABILITY

The β-SiAlON of the present invention may be preferably used as LED a phosphor using a blue or ultraviolet light as a light source.

The light-emitting device of the present invention may be applicable as a backlight for lighting apparatuses, annunciators, and liquid crystal display panels using LEDs.

REFERENCE SIGN LIST

10: Light-emitting device
12: Luminescent source
13: First lead frame
13a: Top surface
13b: Concave
14: Second lead frame
15: Wavelength conversion member
16: Bonding wire
17: Sealing resin
18: Phosphor
19: Cap Although a few embodiments of the present invention have been shown and described, it would be appreciated by those skilled in the art that changes may be made in this embodiment without departing from the principles and spirit of the invention, the scope of which is defined in the claims and their equivalents.

FIG. 1
1. Mixing step
2. Heating step
3. Baking step
4. Annealing step
5. Acid treatment step FIG. 2
1. Mixing step
2. Heating step
3. Baking step
6. Hot isostatic pressing step
4. Annealing step
5. Acid treatment step

What is claimed is:

1. β-SiAlON represented by a general formula $Si_{6-z}Al_zO_zN_{8-z}$ with Eu dissolved therein in a form of solid solution, wherein spin density corresponding to absorption g=2.00±0.02 at 25° C. obtained by the electron spin resonance method is equal to or lower than $6.0×10^{16}$ spins/g, and z is in a range of 0 to about 4.2.

2. A method of manufacturing β-SiAlON represented by a general formula $Si_{6-z}Al_zO_zN_{8-z}$ with Eu dissolved therein in a form of solid solution, wherein spin density corresponding to absorption g=2.00±0.02 at 25° C. obtained by the electron spin resonance method is equal to or lower than $6.0×10^{16}$ spins/g, and z is in a range of 0 to about 4.2., the method further comprising:
 a mixing step of mixing β-SiAlON materials;
 a heating step of heating the mixed material from ambient temperature to 1500° C. and then raising the temperature from 1500° C. to a baking temperature at a rate equal to or lower than 2° C./min.;
 a baking step of baking the mixed materials that have undergone the heating step, with the baking step being conducted at a temperature of about 1850° C. to about 2050° C.;
 an annealing step of annealing the β-SiAlON having undergone the baking step; and
 an acid treatment step of acid-treating the β-SiAlON having undergone the annealing step.

3. A method of manufacturing β-SiAlON represented by a general formula $Si_{6-z}Al_zO_zN_{8-z}$ with Eu dissolved therein in a form of solid solution, wherein spin density corresponding to absorption g=2.00±0.02 at 25° C. obtained by the electron spin resonance method is equal to or lower than $6.0×10^{16}$ spins/g, and z is in a range of 0 to about 4.2. represented by a general formula $Si_{6-z}Al_zO_zN_{8-z}$ with Eu dissolved therein in a form of solid solution, wherein spin density corresponding to absorption g=2.00±0.02 at 25° C. obtained by the electron spin resonance method is equal to or lower than $6.0×10^{16}$ spins/g, and z is in a range of 0 to about 4.2, comprising:
 a mixing step of mixing β-SiAlON materials;
 a heating step of heating the mixed material from ambient temperature to 1500° C. and then raising the temperature from 1500° C. to a baking temperature at a rate equal to or lower than 2° C./min.;
 a baking step of baking the mixed materials that have undergone the heating step, with the baking step being conducted at a temperature of about 1850° C. to about 2050° C.;
 a hot isostatic pressing step;
 an annealing step of annealing the β-SiAlON having undergone the baking step; and
 an acid treatment step of acid-treating the β-SiAlON having undergone the annealing step.

4. The method of manufacturing β-SiAlON as set forth in claim 2,
 wherein the annealing step comprises heating in an inert gas atmosphere with nitrogen partial pressure maintained at 10 kPa or lower and at temperatures from 1350° C. to 1650° C., or in vacuum and at temperatures from 1200° C. to 1500° C.

5. The method of manufacturing β-SiAlON as set forth in claim 3,
 wherein the annealing step comprises heating in an inert gas atmosphere with nitrogen partial pressure maintained at 10 kPa or lower and at temperatures from 1350° C. to 1650° C., or in vacuum and at temperatures from 1200° C. to 1500° C.

6. The method of manufacturing β-SiAlON as set forth in claim 2,
 wherein the β-SiAlON having undergone the annealing step is immersed in a mixture of hydrofluoric acid and nitric acid, or in an ammonium hydrogen fluoride in the acid treatment step.

7. The method of manufacturing β-SiAlON as set forth in claim 3,
 wherein the β-SiAlON having undergone the annealing step is immersed in a mixture of hydrofluoric acid and nitric acid, or in an ammonium hydrogen fluoride in the acid treatment step.

8. The method of manufacturing β-SiAlON as set forth in claim 4,
 wherein the β-SiAlON having undergone the annealing step is immersed in a mixture of hydrofluoric acid and nitric acid, or in an ammonium hydrogen fluoride in the acid treatment step.

9. The method of manufacturing β-SiAlON as set forth in claim 5,
 wherein the β-SiAlON having undergone the annealing step is immersed in a mixture of hydrofluoric acid and nitric acid, or in an ammonium hydrogen fluoride, in the acid treatment step.

10. A light-emitting device comprising:
 the β-SiAlON as set forth in claim 1 and a luminescent source.

11. The β-SiAlON as set forth in claim 1, wherein z is in a range of about 0.02 to about 0.25.

* * * * *